United States Patent
Liao et al.

(10) Patent No.: US 7,484,984 B2
(45) Date of Patent: Feb. 3, 2009

(54) ELECTRICAL CONNECTOR

(75) Inventors: Fang-Jun Liao, Tu-Cheng (TW); Chi-Nan Liao, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/890,870

(22) Filed: Aug. 8, 2007

(65) Prior Publication Data

US 2008/0037235 A1     Feb. 14, 2008

(51) Int. Cl.
  *H01R 4/50* (2006.01)
(52) U.S. Cl. .................................. 439/342
(58) Field of Classification Search .............. 439/71, 439/68, 70
See application file for complete search history.

(56) References Cited

U.S. PATENT DOCUMENTS

| | | | | |
|---|---|---|---|---|
| 4,639,063 A | * | 1/1987 | Mueller | 439/325 |
| 5,329,227 A | * | 7/1994 | Sinclair | 324/158.1 |
| 6,093,042 A | * | 7/2000 | Lemke et al. | 439/341 |
| 7,044,746 B2 | * | 5/2006 | Copper et al. | 439/66 |

* cited by examiner

*Primary Examiner*—Phuong K Dinh
(74) *Attorney, Agent, or Firm*—Wei Te Chung

(57) ABSTRACT

An electrical connector (5) includes a plurality of housings (52), a plurality of contacts received in each housing (52), a bracket (51) defining a plurality of sections (511) for receiving the housings (52) therein. Relative to the related art, the electrical connector (5) defines a plurality of separately housings (52) and a bracket (51) having a number of receiving section (511) for receiving the housings (52) therein, which simplifies the mold process and improves the insulative material injected quality.

1 Claim, 4 Drawing Sheets

ELECTRICAL CONNECTOR

BACKGROUND OF THE INVENTION

1. Field of the Invention

The present invention relates to the art of electrical connectors, and more particularly to a connector for connecting a chip module to a printed circuit board.

2. Description of the Related Art

Generally speaking, a connector to which this invention is applicable is interposed between first and second electronic parts or components having contact pads, respectively, to achieve electrical connection between the first and the second electronic components. In the following description, the first and the second electronic components are a printed board and an LSI circuit, respectively. The connector comprises an insulator provided with a plurality of contact receptacle holes penetrating the insulator in a thickness direction, and a plurality of contacts having an elasticity and inserted into and held in the contact receptacle holes, respectively.

However, in the conventional electrical connectors, housings are usually molded by an injected art, so when housing needs receive more terminal therein for getting a better electrical connection and transmitting more signals, numbers of passageways formed on the housing need be increased correspondingly which leads the housing difficulty to mold or insulative material not fully of moulds.

To address some of these problems, one previous attempt formed a LGA connector from multiple smaller sections that were joined together with separating ribs. Unfortunately, because the separating ribs consumed a significant amount of space on the connector, a substantial depopulated area was provided.

In view of the foregoing, there exists a need for an electrical connector for simplifying the process of the production and avoiding problem of the insulative material which is not full injected.

SUMMARY OF THE INVENTION

An electrical connector according to an embodiment of the present invention is provided to include a plurality of housings, a plurality of contacts received in each housing, a bracket defining a plurality of sections for receiving the housings therein. Relative to the related art, the electrical connector defines a plurality of separately housings and a bracket having a number of receiving section for receiving the housing therein, which simplifies the mold problem and improves the insulative material injected problem Other features and advantages of the present invention will become more apparent to those skilled in the art upon examination of the following drawings and detailed description of preferred embodiments, in which:

DETAILED DESCRIPTION OF PREFERRED EMBODIMENT

Figure 1:
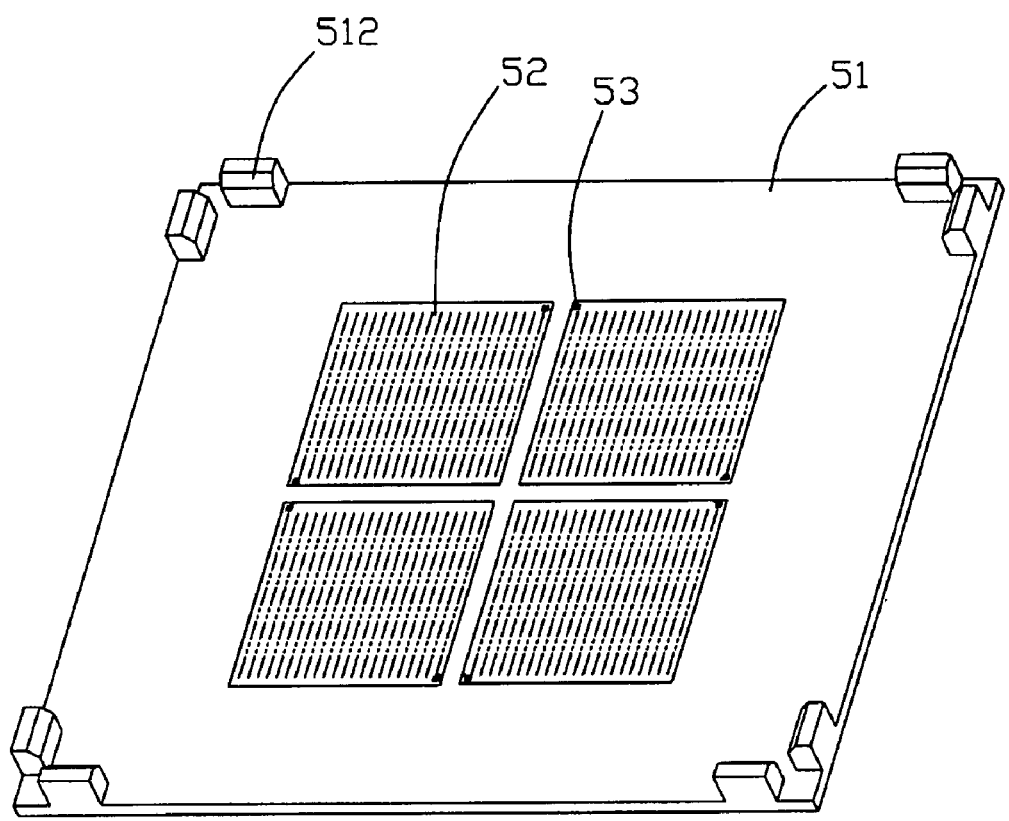
FIG. 1 is a perspective view of a conventional contact.
Figure 2:
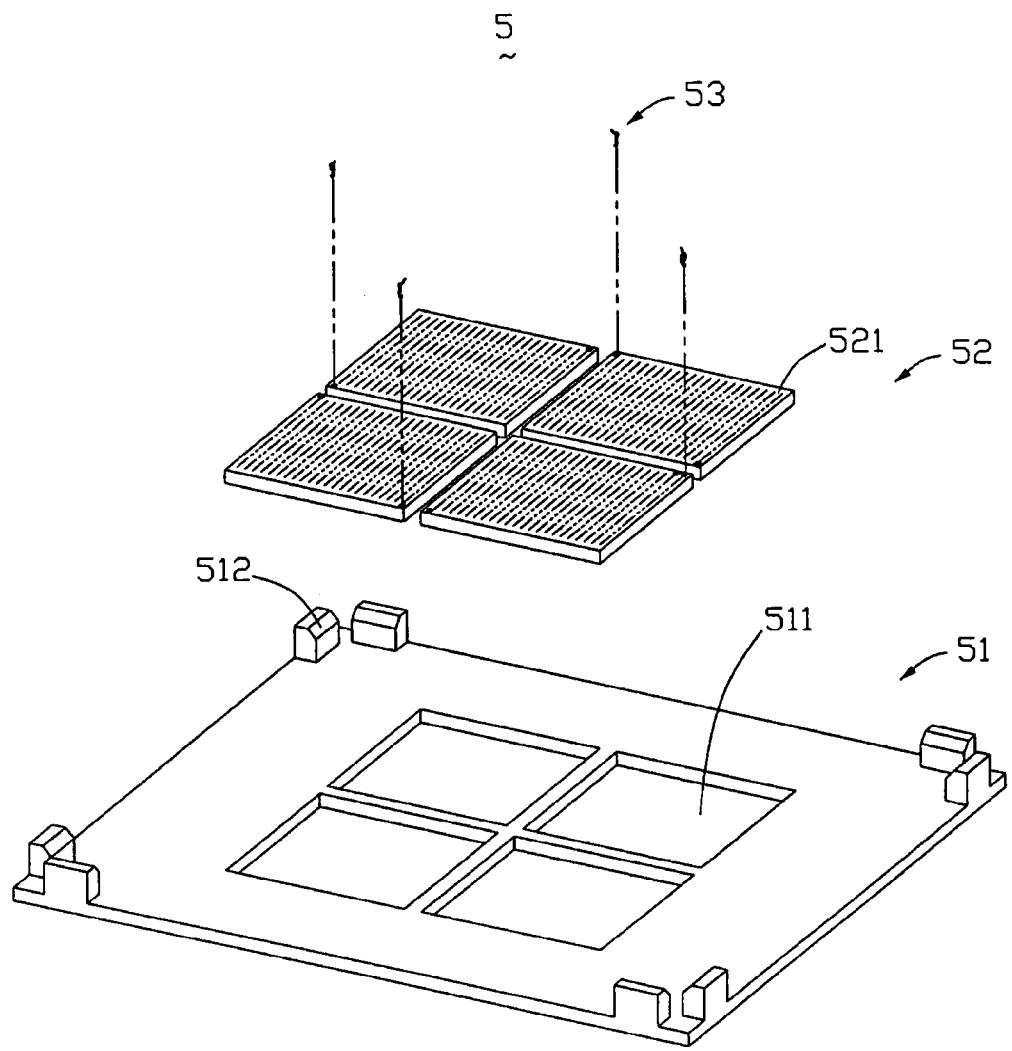
FIG. 2 is a cross-sectional view of the contact of FIG. 1 received in a housing.
Figure 3:
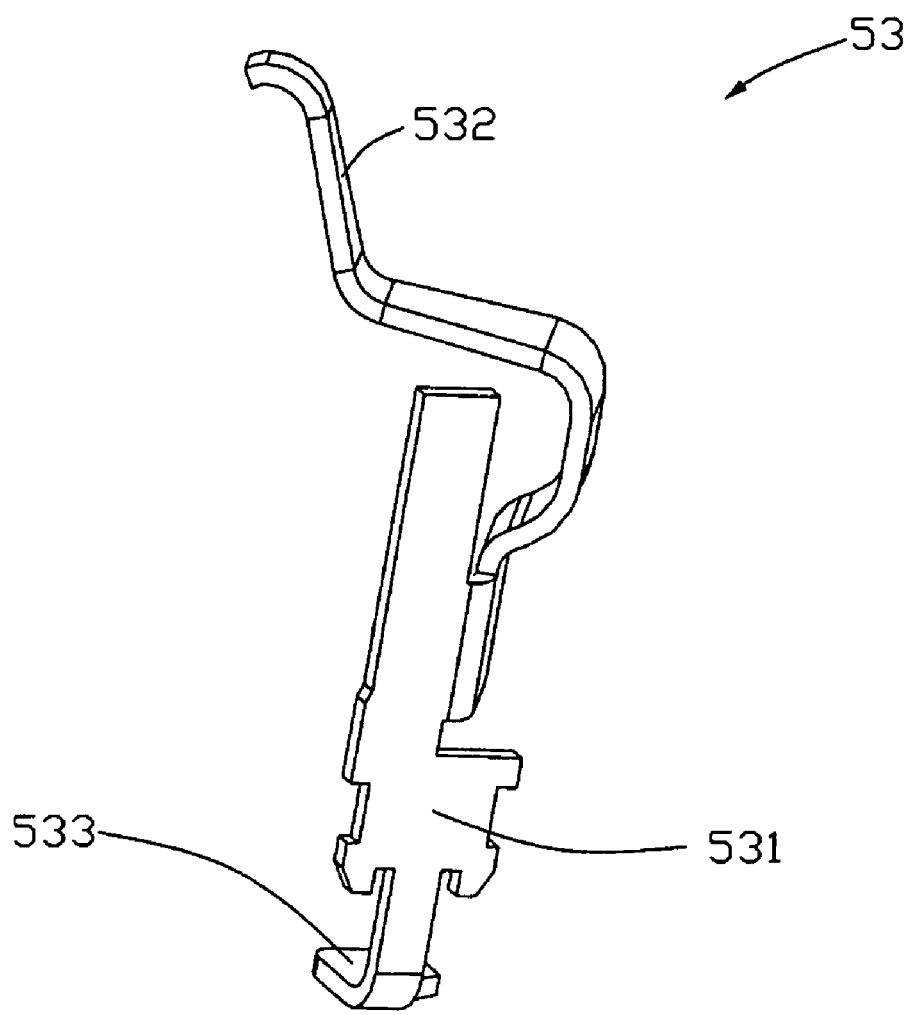
FIG. 3 is an exploded view of an electrical connector contact in accordance with a preferred embodiment of the invention.
Figure 4:
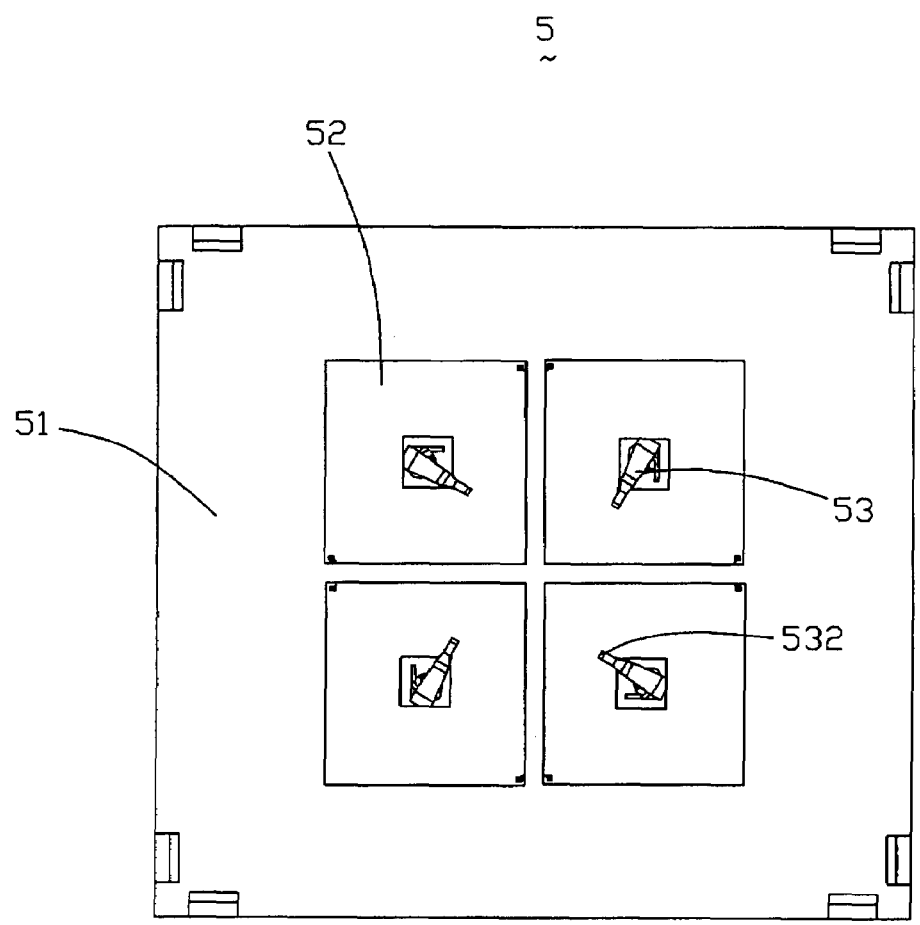
FIG. 4 is an assembled view of the electrical connector shown in FIG. 3.

Referring to FIGS. 1 and 4, an electrical connector 5 in accordance with the present invention for connecting a chip module to a printed circuit board includes a plurality of housing 521 defining a plurality of passageways, a plurality of contacts 53 is arranged within the passageways and a bracket 51 used for bearing the housings 521 therein. In this embodiments, there are four housing 521, and in use, the plurality of housings 521 forms a housing assembly 52 together.

the bracket 51 is formed of a rectangular shape and comprises four receiving sections 511 in a center portion thereof for receiving the housing 521 thereon. Each receiving section 511 is adapted to receiving the housing 521 and in a shape of square. In addition, the receiving sections 511 are separated with each other. The bracket 51 defines a pair of projections 512 on each corner thereof for locating the chip module, spaced and vertical to each other. In addition, the projections 512 can be arranged by other ways, for example, the projections 512 disposed in a same corner can be connected with each other formed a L-shaped structure, which can also provide a locating and supporting to the chip module.

Each housing 521 is in a shape of square and comprises a number of passageways for receiving the terminals 53 therein. The terminal 53 comprises a base portion 531, an elastic portion 532 upwardly and extending from a side of the base portion, a tail portion 533 extending from a lower end of the base portion 531.

In assembly, the housings 521 are locating on the receiving section 511 of the bracket 51 and each housing 521 engages interfering with sidewalls of the bracket 51. Referring to FIG. 4, extending direction of the elastic portion 532 of the terminals 53 received in a same housing 521 is different from that of the other housings 521 wherein, the elastic portions 532 received in the housings 521 disposed in a diagonal direction are arranged in a reversed direction. The arrangement of the elastic portion 532 can provide an antifriction effect produced by the terminals 53 engaging with the housing 521 therein, when the chip module is mounted on the housings 521. In addition, when the chip module is mounted on the housing, the projections 512 of the bracket 51 can provide a supporting and a locating effect to the housing 521. In addition, the bracket 51 is made of metal, which provides a smooth plane for supporting the chip module and avoiding the deformation of the housing 52 received therein.

While the present invention has been described with reference to preferred embodiments, the description of the invention is illustrative and is not to be construed as limiting the invention. Various of modifications to the present invention can be made to preferred embodiments by those skilled in the art without departing from the true spirit and scope of the invention as defined by the appended claims.

What is claimed is:

1. An electrical connector comprising:
   a number of contacts received each comprising an anchoring portion, a spring portion extending from a top end thereof and a solder portion extending from a distal end thereof;
   a number of housings for receiving the plurality of contacts therein;
   a bracket having a rectangular shape and provided with an even plane for supporting an electronic package, the plane having a plurality of openings extending through the bracket for receiving the number of housings;
   wherein the bracket comprises a plurality of projections upwardly extending from said plane for locating the electronic package.

* * * * *